United States Patent [19]

Wallace

[11] 4,183,074
[45] Jan. 8, 1980

[54] MANUFACTURE OF MULTI-LAYERED ELECTRICAL ASSEMBLIES

[76] Inventor: Clarence L. Wallace, 1036 Highland, Solana Beach, Calif. 92075

[21] Appl. No.: 797,193

[22] Filed: May 16, 1977

[51] Int. Cl.² .............................................. H05K 1/04
[52] U.S. Cl. .................................... 361/402; 336/200
[58] Field of Search ...................... 361/402, 414, 401; 336/200

[56] References Cited

U.S. PATENT DOCUMENTS

| | | | |
|---|---|---|---|
| 2,752,537 | 6/1956 | Wolfe | 361/414 |
| 2,779,975 | 2/1957 | Lee et al. | 29/625 |
| 3,040,213 | 6/1962 | Byer et al. | 361/401 |
| 3,398,326 | 8/1968 | Swart et al. | 361/402 |
| 3,543,194 | 11/1970 | Kassabgi | 361/414 |
| 3,701,958 | 10/1972 | Jaag | 361/414 |
| 3,812,442 | 5/1974 | Muckelroy | 336/200 |
| 3,913,224 | 10/1975 | Preissinger et al. | 361/402 |

Primary Examiner—David Smith, Jr.
Attorney, Agent, or Firm—William W. Haefliger

[57] ABSTRACT

A method for fabricating electrical component assemblies includes the steps:
(a) providing a first electrode and a first electrical component and locating the electrode in a recess formed by the component to produce a first laminate sub-assembly,
(b) providing a second electrode and a second electrical component and locating the electrode in a recess formed by the second component to produce a second laminate sub-assembly, and
(c) locating said two sub-assemblies in mutually stacked relation, thereby to form a resultant assembly.

The components are typically provided by deposition on the electrodes and to protrude edgewise thereof beyond selected edges of the electrodes, thereby to form electrical contacts, and said locating of the sub-assemblies is carried out to cause said contacts to protrude in at least two different directions from the resultant assembly. The components typically consist of dielectric material, and the electrodes are typically deposited in the form of electrically conductive ink.

1 Claim, 34 Drawing Figures

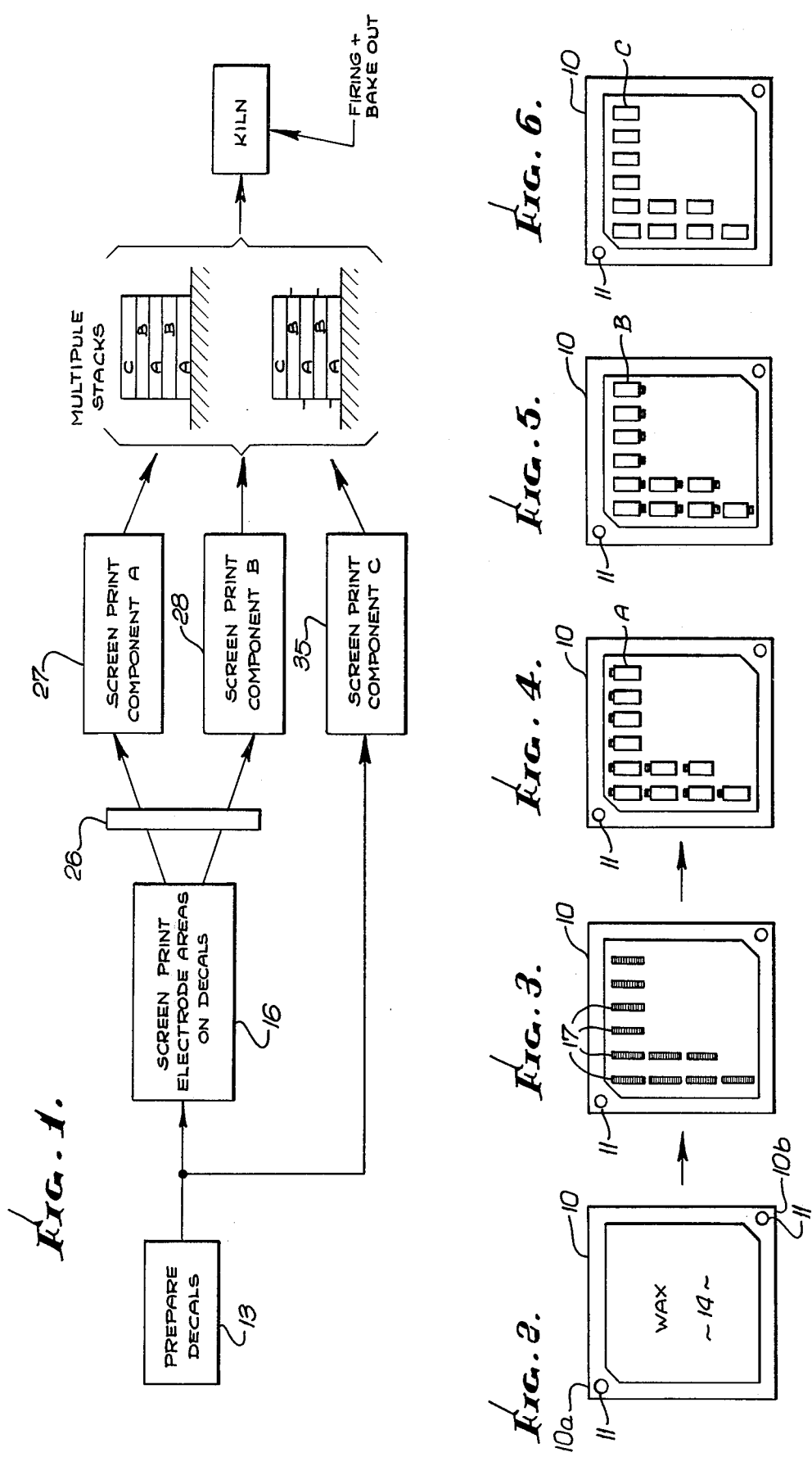

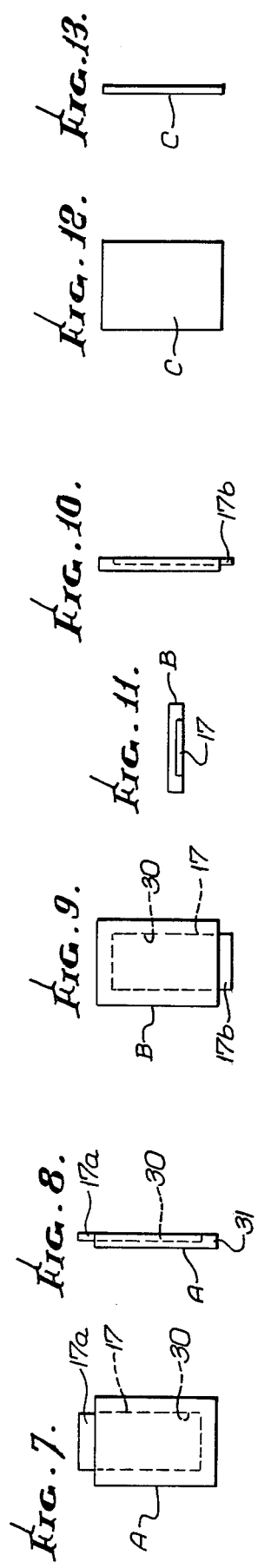

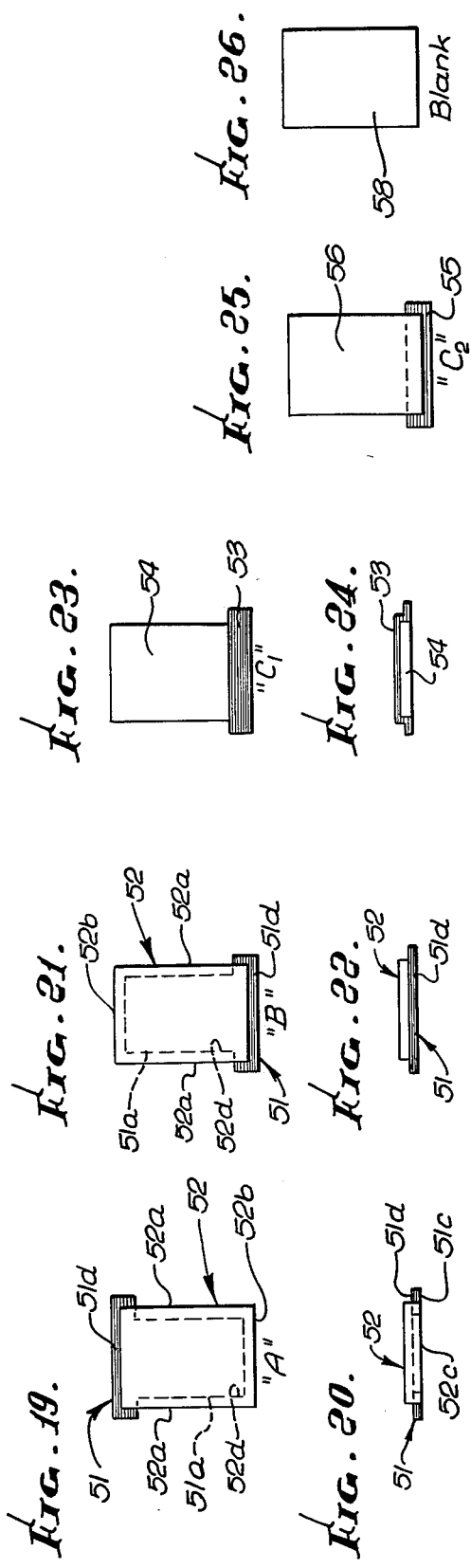
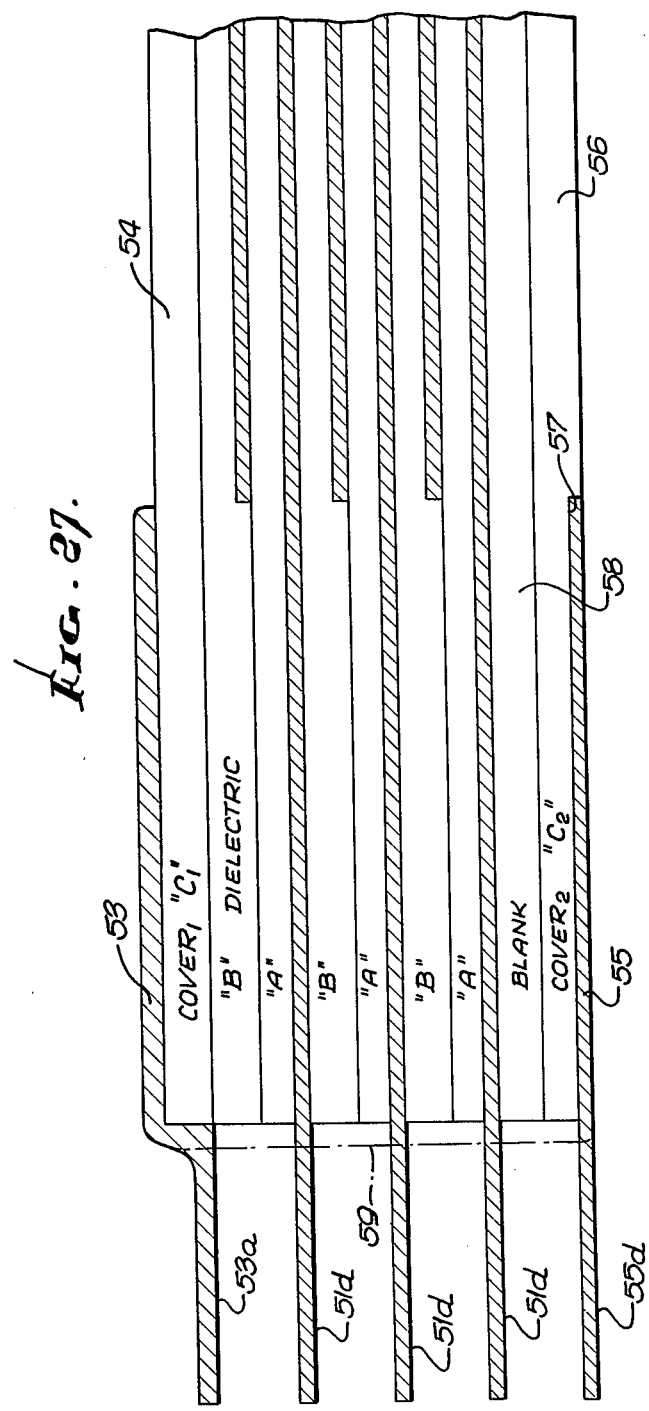

MANUFACTURE OF MULTI-LAYERED ELECTRICAL ASSEMBLIES

BACKGROUND OF THE INVENTION

This invention relates generally to the production of multilayered components, and more particularly concerns process and apparatus to produce multilayered electrical components; additionally, the products produced by the process are part of the invention.

Conventional processes for producing commercial multilayer capacitors employ the following steps:

1. Casting a ceramic slip by use of a doctor blade to form a green, dried ceramic film of 0.001" to 0.002" thickness;
2. Printing a registered matrix of metal pigmented inks to form the electrodes of the finished capacitor on the ceramic film;
3. Stacking a number of the registered electrode matrices in a cavity and laminating the stack of printed ceramic sheets with pressure and heat to form a compacted structure;
4. Cutting the compacted structure as by use of a guillotine type cutter.

The number of parts generated is determined by the number of electrodes in the printing matrix;

5. Thermal processing consists of a drying and bake out cycle to eliminate the organic components from the green parts, followed by a firing cycle to 2,000° F. to 2,300° F. to form the final ceramic structure.
6. Metallizing the ends of each individual capacitor element is necessary to achieve the desired electronic configuration. This is accomplished by applying a small amount of a fritted silver paint to each end of the ceramic capacitor element. After both ends are dried, the parts are fired to form metallic surfaces by which the appropriate individual electrodes within the ceramic are interconnected, and also by which the finished part may be connected to an electronic circuit.
7. Testing for the various electrical parameters completes the manufacturing process.

The controls necessary to achieve a satisfactory yield of capacitors of a specified value are indicated by the mathematical relationships related in the design equation:

$$C = 0.224(nkA/d)pf \quad (1)$$

where,
C = capacitance of the device
n = number of active layers
k = dielectric constant of ceramic film
A = active area of an electrode (fired)
d = fired thickness of the dielectric film (in thousandth of an inch)

To achieve a given value for capacitance C one must accurately control values of these parameters, as follows:

(d) Dielectric thickness (typically 0.0013"±0.0001"), and (k) Dielectric constant. Control of this parameter is not only related to "lots" (i.e. differently fired groups) but also requires a very carefully controlled firing profile for consistant results. "Lot" k values are statistically determined before releasing material to production. A number of ceramic formulations are used, each with its own unique configuration of electrical parameters. They usually are referred to as "bodies" i.e. k1200 body would be a ceramic whose k is 1200.

(A) The active area of the electrode. In this regard, the electrode configuration is usually a function of mechanical constraints since it sets the size of the capacitor. Controls relating to the electrode consist of using the lowest cost precious metal electrode alloy consistent with the processing temperature and body chemistry, and controlling the electrode thickness. In this regard, changes in thickness cause a second order effect on capacitance. Also, if the electrode material is too thin as applied, areas of the electrode may be non-conductive and the effective area A will be lowered.

(n) Number of active layers is important, in that once the size of the capacitor (length and width) has been set by space available, and the dielectric type and thickness are chosen as a function of the electrical circuit requirements, the number of layers (n) can be adjusted to achieve the design capacitance. Clearly, there are limits to the least and most capacitance available. The upper limit of "n" for a given part type is somewhere around 40 layers, since yield of good parts starts declining rapidly beyond that. Many parts with more layers are sold however, since high capacitance coupled with small size of a part is a premium condition and commands higher prices. It is difficult to maintain uniform, undistorted internal structures in these high layer parts because of the green ceramic density variations introduced in the manufacturing process. These result in shrinkage variations upon firing, which produce material distortions appearing as delaminations of the layered structure of the capacitor. This is the most serious mechanical defect which results from conventional production of multilayer capacitors, and one for which there is no non-destructive test available. If a production lot is sampled by making petrographic tests, and it is found that delaminations are occuring above a certain percentage (it varies as a function of end use), the whole lot must be scrapped.

SUMMARY OF THE INVENTION

It is a major object of the invention to provide a new process which greatly simplifies the manufacture of multilayered components, as for example by elimination of steps 4 and 6 above (these being the most costly from the standpoint of labor involved).

Basically, the process includes the following steps:

(a) providing a first electrode and a first electrical component and locating the electrode in a recess formed by the component to produce a first laminate sub-assembly, (b) providing a second electrode and a second electrical component and locating the electrode in a recess formed by the second component to produce a second laminate sub-assembly, and (c) locating said two sub-assemblies in mutually stacked relation, thereby to form a resultant assembly.

As will appear, multiple first electrodes and first components may be formed on a first decal to produce first laminate sub-assemblies; multiple second electrodes and second components may be formed on a second decal to produce second laminate sub-assemblies; and the decals may be manipulated to remove first or type A sub-assemblies onto a setter, to remove the second or type B sub-assemblies to stack precisely on the A sub' assemblies, and this may be repeated to build-up stacks of desired numbers of electrodes, thereby to form assemblies in the form of capacitors, coils, resistances, or combinations thereof.

Additional objects include the provision of methods to interconnect electrodes in stacked sub-assemblies; to locate sub-assemblies in precise registered relation; to build-up stacks with covering components at upper and lower ends of the stacks; and to achieve fabrication of such assemblies of many different sizes at very low cost and at high production rates.

Further objects include the provision of apparatus or tooling to enable such fabrication, and the provision of the resultant sub-assemblies and assemblies, themselves.

These and other objects and advantages of the invention, as well as the details of illustrative embodiments, will be more fully understood from the following description and drawings, in which:

DRAWING DESCRIPTION

FIG. 1 is a flow diagram;

FIG. 2 is a plan view of a prepared decal;

FIG. 3 is plan view of the FIG. 2 decal with screen printed electrodes thereon;

FIG. 4 is a plan view of the FIG. 3 composite with "A type" electrical components screen printed on the electrodes and decal;

FIG. 5 is a plan view like FIG. 4 but with "B type" components screen printed on electrodes and on the decal;

FIG. 6 is a plan view like FIG. 4 but with "C type" components printed directly on the decal, i.e. with no electrodes;

FIG. 7 is an enlarged plan view of an "A type" component and electrode composite;

FIG. 8 is a side view of the FIG. 7 composite;

FIG. 9 is an enlarged plan view of a "B type" component and electrode composite;

FIG. 10 is a side view of the FIG. 9 composite;

FIG. 11 is an end view of the FIG. 9 composite;

FIG. 12 is an enlarged plan view of a "C type" component;

FIG. 13 is a side view of the FIG. 12 component;

FIG. 14 is a schematic elevational view of a screening process to deposite electrodes on a decal;

FIG. 15 is a schematic elevational view of a screening process to deposite electrical components, on the electrodes previously deposited as in FIG. 14;

FIG. 16 is a schematic elevational view of the FIG. 15 composites after inversion on to a support, and showing peeling of the decal;

FIG. 17 is a view like FIG. 16 but showing both A and B type composites, one stacked on the other, and a decal for the upper composites being peeled away;

FIG. 18 is a side elevational view showing a completed multi-layered electrical assembly prior to firing;

FIG. 18a is like FIG. 18, but shows a completed capacitor;

FIG. 19 is a view like FIG. 7 showing a varied, i.e. A' composite;

FIG. 20 is an end view of the A' composite of FIG. 19;

FIG. 21 is a view like FIG. 9 showing a varied, i.e. B' type composite;

FIG. 22 is an end view of the FIG. 21 composite;

FIG. 23 is a view like FIG. 21, showing a varied, i.e. $C_1$ type composite;

FIG. 24 is an end view of the $C_1$ composite;

FIG. 25 is a view like FIG. 23 showing a further varied, i.e. $C_2$ type composite;

FIG. 26 is a view like FIG. 12 showing a blank component;

FIG. 27 is an enlarged side elevation of a stack of composites as seen in FIGS. 19–26;

DETAILED DESCRIPTION

Figure 28:
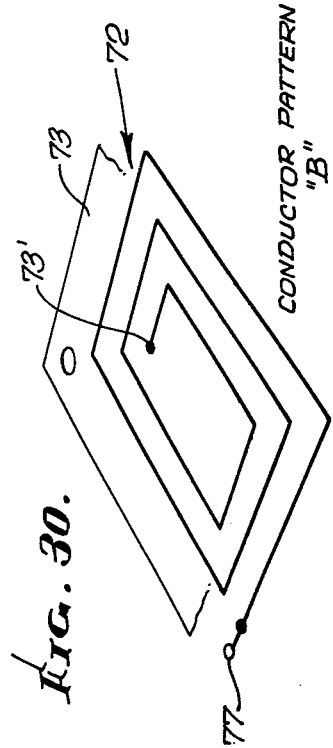
FIG. 28 is a perspective view of a spiral (left handed) electrode pattern.

Referring first to FIGS. 1 and 2, the process contemplates the provision of carriers such as flexible decals 10, which are initially prepared. Such preparation, indicated at 13, may advantageously include punching holes 11 through the rectangular decal sheets, as for example proximate to opposite corners 10a and 10b. Such holes closely fit guide posts, as are better seen at 12 in FIGS. 14–17, in order to guide the decals into accurate registration upon assembly of electrode and electrical component composites. Typical transfer decals are formed by 6 inch by 6 inch square sheets of MYLAR plastic material. The surface of the decal is further prepared by application of a thin coating of a transfer release agent 14 as for example wax. Such agent is somewhat tacky at room temperature to retain the composites for transfer, and may easily release them in response to heating of the wax.

Next, multiple first electrodes are provided in spaced apart and supported relation on a first carrier, i.e. a first decal 10a. This step is indicated at 16 in FIG. 1, and FIG. 3 shows rows and columns of such electrodes 17 on the decal. Referring to FIG. 14, this step may be carried out by screening a fluid mix which includes the electrode material onto the decal. Note the screen 18, suitably supported at 19, and a template 20 on the screen with openings 21 directly over the locations at which the mix is deposited onto decal as electrodes 17. A squeegee blade 23 may be passed over the template, as shown, to force fluid mix 22, through the openings 21 onto the screen and onto the decal. Note guide posts 12 passed through registration holes in the decal, screen and template. The electrodes may have rectangular shape, as shown, or any other desired shape. Electrode liquid mixes are known as "inks", and representative inks are identified as Conductive Inks produced by Du Pont, Selrex, Cladan Inc., and others. Curing of the electrodes to said form may be accelerated under mild heating as indicated at 26 in FIG. 1. In addition, to the use of air drying inks for both the electrode and dielectric functions, the use of Electro-Therm inks is included. This technique enables use of an "ink" or transfer mechanism which is a solid at room temperature but is of an ink-like consistancy at room temperatures 10° to 100° F. above ambient. Upon being "screened" or printed onto the substrate using a heated screen or template, the ink freezes to a "dry" or solid state and may be immediately processed to the next operational step. Such a material is a product of the Ferro Corp., and is marketed under the name "Electro-Therm Inks".

Next, and as shown at 27 in FIG. 1, multiple electrical components A are deposited on the formed electrodes 17 on certain decals to produce first laminate sub-assemblies, this step also appearing in FIG. 4. Likewise, components B are deposited on formed electrodes on other decals as indicated at 28 in FIG. 1 and in FIG. 5, to produce second laminate sub-assemblies. Typically, and extending the description to FIG. 15, the source of the components consists of a comminuted dielectric material such as a ceramic, in a liquid carrier, supplied at 29. A squeegee blade 131 is passed over a template 32 to urge the liquid mix through template openings 33 and through a screen 34 for deposition on the electrodes. It will be noted that the deposition of the mix is onto part, but not all, of each electrode, and also onto the decal; for example, the electrode may protrude at one end of the deposited material A, for example, and the material A deposited on the decal at the opposite end of the electrode. This is also clear from FIGS. 7 and 8 wherein an electrode lamination 17 is shown locally protruding at 17a endwise from the component A lamination, the latter forming a three-sided recess 30 in which the remainder of the electrode is received. The component A also extends at the end of the electrode, i.e. at 31, for purposes as will appear. Similarly, in FIGS. 9–11, the component B forms a recess 30 in which another electrode 17 is received, and from which the electrode protrudes at 17b. FIGS. 12 and 13 illustrate a blank component C of a size corresponding to the like sizes of components A and B, so that they may be stacked as in FIGS. 1 and 18. Step 35 in FIG. 1 indicates the screen formation of C component, also seen in FIG. 6, A, B and C components, in the FIGS. 4–6 showings, have corresponding row and column orientation, in the same spacial relation to decal corner openings 11, for later precision registration of the decals and components.

The components A, B and C are allowed to cure, i.e. solidify, on the decals, as for example at room temperature, or more quickly under slight heat application (as for example by infra-red lamp heating). During such curing, the solvent or liquid carrier evaporates, allowing the component particles and resin binder to coagulate. Examples of such component mixes are those known in the trade as dielectric pastes, and are products of such companies as E. I. DuPont, and Selrex.

Finally, the sub-assemblies as represented in FIGS. 4 and 5, and also FIG. 6, are brought into mutually stacked relation, thereby to form resultant assemblies. To this end, the carriers or decals are displaced to effect precision registration of the sub-assemblies, and the carriers are suitably removed, as by heat application and peeling away from the sub-assemblies. FIG. 16 shows sub-assemblies that embody component material B inverted and placed onto a plate 40, with predetermined precision location as effected by placement of decal corner openings 11 onto guide posts 12a. Slight heat application, as by lamp 41, melts the tacky wax on the decal, which held the sub-assemblies thereto during manipulation of the decal, and allowing peel-away of the decal. If necessary, a wax coating on the surface of plate 40 may be used to hold the sub-assemblies in position. Thereafter, FIG. 17 shows precision stacking of sub-assemblies embodying components A onto the sub-assemblies embodying components B, by inversion and placement of decal 10b into the position shown, with corner holes on posts 12a. Peel-away of the decal is also shown.

In this manner, a built-up stack or assembly as shown at 44 in FIG. 18 may quickly be realized. Note that the stack is formed with tabs of successive electrodes in the stack exposed at opposite ends of the stack. No large laminating force, i.e. to compress the stack, is required because the metal electrode in each sub-assembly is flush with its associated component or dielectric surface, as explained above. This then obviates or prevents density distortions which in the past have led to serious delamination problems. FIGS. 17 and 18 also show the stacks on a setter 40 upon which drying and firing of the stacks takes place. This eliminates hand loading which was previously required to maintain the parts in separated relation so as not to fuse together.

The exposed electrode tabs at each end of the stack melt and fuse together during the bake-out cycle, whereby alternate electrodes are electrically joined, at $17a'$ and $17b'$ to form a capacitor, as seen in FIG. 18a. Many different and more complex configurations can be made in this manner, and in both large, medium and small sizes.

The preceding drawing descriptions have concerned quite simple electrodes for conceptual purposes. In actual practice, a more complicated electrode configuration can be used, as shown in FIGS. 19–27. In FIGS. 19 and 20 the flat electrode 51 has T shape or outline, the "stem" 51a of the T located inwardly of the outer sides 52a and end 52b of ceramic lamination or component 52. Note that the electrode is "sunk" in a recess 52d formed by the component 52 so that the underside 51c of the electrode is flush with the underside 52c of the component 52. The cross-bar 51d of the T-shaped electrode protrudes at the opposite end of the component 52, and also protrudes laterally beyond the laterally opposite sides 52a. This sub-assembly is designated "A". A similar "B" sub-assembly is shown in FIGS. 21 and 22, the difference being that the A and B electrode cross-bars are located at opposite ends of the ceramic components. The $C_1$ sub-assembly of FIGS. 23 and 24 differs in that the electrode material 53 overlaps and stands out above the end surface of the ceramic component 54. Also, it protrudes endwise at 53a, as seen in FIG. 27. This $C_1$ sub-assembly is adapted to form an upper "cover" in the stack formed as shown in FIG. 27. The FIG. 25 $C_2$ sub-assembly again differs in that the electrode material 55 is "sunk" in a recess 57 formed by ceramic component 56, as seen in FIG. 27; also the electrode material protrudes endwise at 55a. $C_2$ forms a lower cover at the stack. FIG. 26 shows a blank ceramic component 58, and is also shown in the stack between cover $C_2$ and a sub-assembly A.

Upon heating of the formed stack, as during firing, the protruding electrodes 53a, 51d and 55a soften and fuse together, as indicated by dotted line 59. The same thing occurs at the opposite ends of the sub-assemblies at the opposite side of the FIG. 27 stack. A multi-plate capacitor is thereby formed. Note that electrode material associated with the covers $C_1$ and $C_2$ is exposed at opposite ends of the stack.

The result of using this FIG. 27 electroding configuration is the formation of the end terminations at the same time as the stack is fired. This has more significance than merely the elimination of one step. For example, the sizes of capacitors at the small end of the spectrum is limited by the difficulty of silvering the tiny pieces. This new approach allows a five-fold reduction in size, i.e. the lower size limit would be approximately 0.010" square. Also part shapes would not be limited to parallelapipeds or cylinders; i.e. literally any area shape is possible.

This new process also permits all the in-process step controls that the conventional system does. It allows the inspection of both the electrode print and dielectric print for perfection and thickness before commitment to actual construction (something the spray type systems do not do). It also makes possible the use of thinner dielectric because of the electrode/dielectric configuration (embedded electrode). This makes possible the provision of a 25 volt capacitor designed to take advantage of the lower voltage (four times the capacitance for a given volume, or less than half the precious electrode material required, for the same capacitance) rather than just elevating a 50 volt unit.

The elimination of the cutting operation also enables the production of a more "reliable" part for high reliability requirements. One of the major concerns of recent high reliability studies performed by Hughes Aircraft Co., for the U.S. Navy is the presence of small micro cracks that can be detected on the cover plate surfaces adjacent to the silvered ends of the capacitors. They occur randomly on parts in a given lot, and are not detectible except by visual inspection magnified 400 times or more. Such cracks have proven to be the loci of a number of failure modes experienced in life testing. The source of these cracks is the cutting operation, which is eliminated by the present invention.

Besides reducing the number of steps required to manufacturer parts along with the lower capital investment required, a list of advantages for the new system is as follows:

1. Smaller parts possible to fabricate.
2. Lower voltage ratings.
3. No shape limitations.
4. In process inspection enhanced.
5. Elimination of cutting stress cracks.
6. Elimination of internal delamination caused by laminating stress disturbing green density.
7. Lower labor "content" per part, i.e. less labor required to fabricate.
8. End terminations of electrodes enable provision of a variety of tab configurations with no extra process time.
9. Inventory can partially be carried in decal form, allowing for rapid response to customers. Thus, the decals can be processed as in FIGS. 16 and 17 to build-up capacitor plates and configurations, as required.
10. The invention enables provision of a line of capacitors adapted to use with semi-conductor devices, mounted on the silicon substrates such as LSI devices in watches, calculators multi processors, etc.

The procedure described above, used to manufacturer multilayer ceramic capacitors, is also adaptable to a number of other electronic ceramic devices. An example would be multilayer ferrite inductors.

Referring to FIGS. 28–32, the method of producing an electrical coil includes the following basic steps:

(a) forming multiple laminates, each laminate including electrically conductive material in the form of a portion of a coil, and non-conducting material laminated to said electrically conductive material, and (b) stacking said laminates so that said coil portions are located for electrical interconnection to form coil structure.

Figure 29:
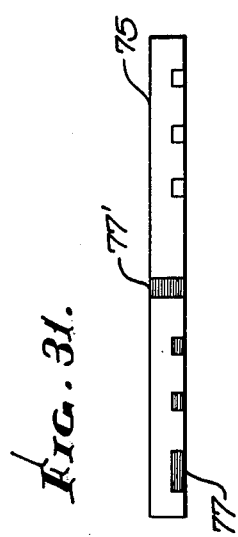
FIG. 29 is an elevational view of a composite which incorporates the FIG. 28 electrode.
Figure 30:
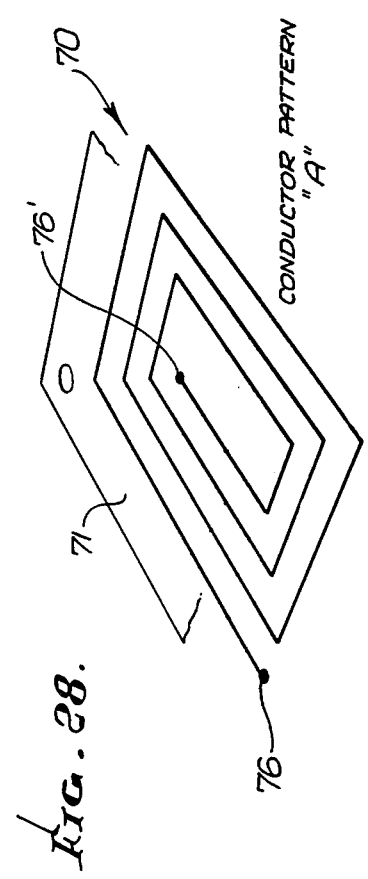
FIG. 30 is a perspective view of a spiral (right handed) electrode pattern.
Figure 31:
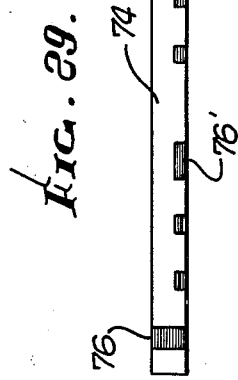
FIG. 31 is an elevational view of a composite which incorporates the FIG. 30 electrode.
Figure 32:
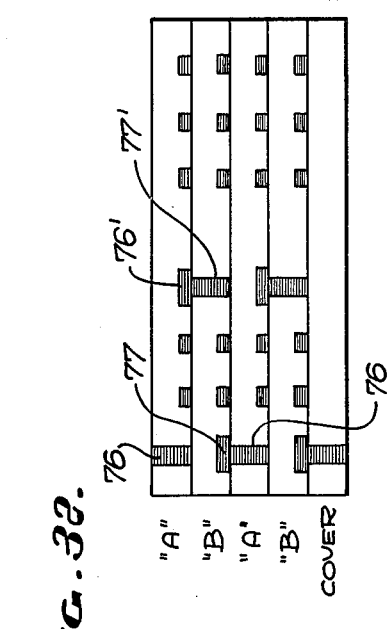
FIG. 32 is an elevational view of an assembly which incorporates the FIGS. 29 and 31 composites, in alternating relation, to form a coil.

In FIG. 28 a left handed spiral coil "electrode" pattern 70 is initially formed on a decal 71 in the manner described above; similarly a right handed spiral coil pattern 72 is formed on a decal 73, as seen in FIG. 30. FIGS. 29 and 31 show deposition of ferrite ceramic "component" material 74 and 75 on the two coils, to form composites "A" and "B". The formation of stack 75 shown in FIG. 32 involves stacking the upright A and inverted B composites. The coils have end terminations 76 and 77 which protrude at edges of the composites as shown in FIGS. 29, 31 and 32. Similarly, the coils have terminations 76' and 77' which are spaced inwardly from the edges of the composites. Terminations 77' extend all the way through the components 75 so as to contact terminations 76'. After heating, the interengaged terminations become fused to provide a complete coil. Laborious and expensive winding of coils is thereby obviated, and many sizes of coils can be easily fabricated at low cost.

Interleaving patterns would produce transformer configurations, magnetic amplifiers, saturable reactors, solenoids, memory cores, etc.

Another example would be multilayer substrates which are layered ceramic structures with buried metal circuitry.

Another possibility is semiconductor packages, such as the dual line configured packages.

Figure 33:
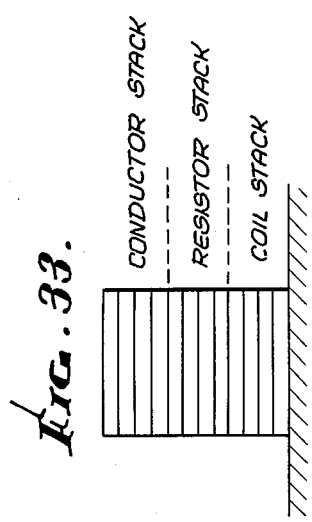
FIG. 33 is an elevation showing a combination of assemblies.

A further possibility is the fabrication of precision resistors, i.e. with electrically resistive material constituting the "electrodes". For example, series connected resistors may be provided as in the FIG. 32 stack, or in another arrangement of electrodes. Series connected resistors and coils may be provided in this way, too, and capacitors may be included, all in one stack. See FIG. 33 in this regard.

I claim:

1. An electrical assembly comprising
   (a) a first stack of laminar components,
   (b) a second stack of laminar components,
   (c) said stack including laminar elements forming electrical elements consisting of stabilized ink, the electrical elements of the two stacks being connected at one end at least of each stack,
   (d) each electrical element selected from the group that includes resistance, capacitance and inductance,
   (e) said laminar components including dielectric components, the electrical elements embedded in associated dielectric components excepting for end portions of the electrical elements that protrude beyond the ends of the dielectric components, each dielectric component formed as a unitary layer so that the electrical element has only one exposed side surface located in a plane formed by its associated dielectric component material adjacent two spaced apart edges of the electrical element and adjacent one end of the electrical element remote from said end portion,
   (f) the said protruding end portions of the stabilizer ink electrical elements being connected as defined, said connected end portions characterized as fused together adjacent said ends of the stacks.

* * * * *